(12) United States Patent
Nakanishi et al.

(10) Patent No.: US 8,223,583 B2
(45) Date of Patent: Jul. 17, 2012

(54) ROW ADDRESSING

(75) Inventors: Takuya Nakanishi, Tsukuba (JP);
Takumi Nasu, Tsuchiura (JP);
Yoshinori Fujiwara, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/071,911

(22) Filed: Mar. 25, 2011

(65) Prior Publication Data
US 2011/0170365 A1    Jul. 14, 2011

Related U.S. Application Data

(62) Division of application No. 12/125,598, filed on May 22, 2008, now Pat. No. 7,933,162.

(51) Int. Cl.
*G11C 8/00* (2006.01)
*G11C 7/00* (2006.01)
(52) U.S. Cl. .............. 365/230.08; 365/200; 365/230.03; 365/230.06
(58) Field of Classification Search .............. 365/200, 365/230.03, 230.06, 230.08; 711/202
See application file for complete search history.

(56) References Cited

U.S. PATENT DOCUMENTS

| 6,324,105 B1 * | 11/2001 | Shirley ......................... 365/200 |
| 2003/0084370 A1 * | 5/2003 | Shore ............................... 714/8 |
| 2005/0002243 A1 * | 1/2005 | Mohr et al. ................... 365/200 |
| 2005/0174862 A1 | 8/2005 | Watanabe et al. |
| 2007/0279984 A1 | 12/2007 | Mori et al. |
| 2009/0285043 A1 | 11/2009 | Nasu et al. |
| 2009/0290440 A1 | 11/2009 | Nakanishi et al. |

* cited by examiner

*Primary Examiner* — Ly D Pham
(74) *Attorney, Agent, or Firm* — Fletcher Yoder (57) ABSTRACT

Embodiments are provided that include a row decoder, including a row activation path, having a row address converter with an output coupled to an input of a section replacement detector. Further embodiments provide a method including mapping an external row address to an internal row address, wherein the internal row address comprises a section address, determining whether a section corresponding to the section address includes an error, and if the section includes an error, converting the internal row address to a redundant row address, wherein mapping the external row address to the internal row address is initiated prior to determining whether the section replacement should be performed. Further embodiments include a method for receiving a row address for a row in a memory section including a non-$2^n$ number of normal rows and mapping the row address to a redundant row address by subtracting a value from the row address.

21 Claims, 8 Drawing Sheets

ROW ADDRESSING

CROSS-REFERENCE TO RELATED APPLICATION

This application is a divisional of U.S. patent application Ser. No. 12/125,598, which was filed on May 22, 2008.

BACKGROUND

1. Field of the Invention

Embodiments of the invention relate generally to the field of memory devices and, more particularly, to a system and method of address mapping and section replacement within a memory device.

2. Description of the Related Art

DRAM memory is a volatile memory that can be electrically erased and reprogrammed. DRAM memory generally stores information via an access device (e.g., a FET) and a capacitor, which are generally referred to in combination as a "cell." Each cell traditionally stores one bit of information that is represented as a "0" or a "1". The memory device often includes a grid-like arrangement including rows and columns of cells that are referred to as a block. Multiple blocks are combined to form a memory array. Unfortunately, not all of the cells and blocks of the memory array are usable. For example, some cells and blocks are unusable (i.e., bad) when the memory device is manufactured and/or some of the cells and blocks fail over the life of the memory device. Memory device designers typically account for this with repair schemes that move the data from bad cells and blocks to good cells and blocks (e.g., redundant rows and/or columns within the memory array). Typically, these repair schemes employ techniques to redirect requests to the good cells (e.g., redundant rows).

Compared to older memory devices that included smaller storage capacities and smaller memory arrays, current memory devices include larger memory arrays with an increased number of cells and blocks. With the increase in the size and in the number of cells and blocks, there is an increase in the probability that a memory device will experience failures. Accordingly, one repair scheme may include increasing the number of redundant rows and columns to account for the increase in the number of expected failures. Unfortunately, as the redundancy within the memory increases, repair can become increasingly difficult for several reasons. For instance, the mere addition of redundant rows and columns can undesirably increase the size of the memory device. Further, addressing can become complex as the memory array becomes larger and the repair scheme covers the larger area of the memory array, and more devices may be employed to implement the repair scheme. Increases in complexity can also lead to decreases in the speed of the memory as more complex layouts and schemes are employed to access data.

Embodiments of the present invention may be directed to one or more of the problems set forth above.

DETAILED DESCRIPTION OF SPECIFIC EMBODIMENTS

As discussed in further detail below, the disclosed systems and methods relate to a row addressing scheme for section-replacement within a memory device. More specifically, certain embodiments include a row address mapping that is configured to map an external address to an internal address that is suitable for simplified section replacement. In some embodiments, a system employing row address mapping includes a redundant row activation path having a row address converter that is configured to map an external address to an internal address (e.g., an internal row address). In some embodiments, the internal address enables simplified section replacement. In some embodiments, the row address converter is employed prior to a section replacement detector, and, in some embodiments, the row address converter is employed in parallel with a section address generator. Accordingly, embodiments that employ one or more of these techniques are believed to increase the speed of the redundant row activation path by employing address mapping prior to a section replacement detector. Before a detailed discussion of the system and methods described in accordance with various embodiments of the present invention, it may be beneficial to discuss embodiments of memory devices that may incorporate the devices described herein, in accordance with embodiments of the present technique.

Figure 1:
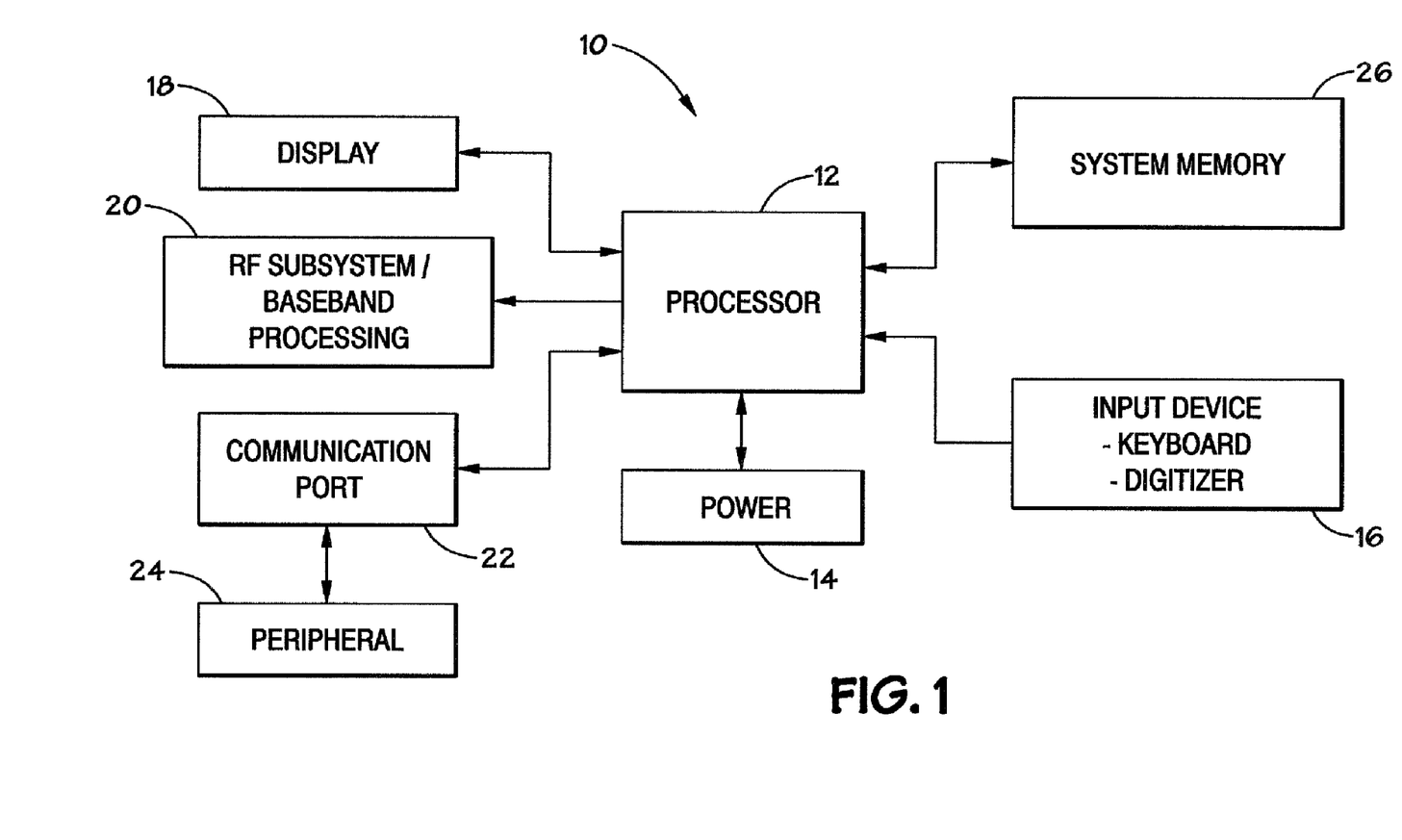
FIG. 1 is a block diagram that illustrates a processor-based device having a memory that includes memory devices fabricated in accordance with one or more embodiments of the present invention.

Turning now to the figures, FIG. 1 includes a block diagram depicting a processor-based system, generally designated by reference numeral 10. The system 10 may be any of a variety of types such as a computer, pager, cellular phone, personal organizer, control circuit, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so that the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example.

Furthermore, an RF sub-system/baseband processor 20 may also be coupled to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, memory is used in conjunction with the processor 12. Generally, the memory is coupled to the processor 12 to store and facilitate execution of various programs. For instance, the processor 12 may be coupled to system memory 26, which may include volatile memory, such as Dynamic Random Access Memory (DRAM) and/or Static Random Access Memory (SRAM). The system memory 26 may also include non-volatile memory, such as read-only memory (ROM), EEPROM, and/or flash memory to be used in conjunction with the volatile memory. As discussed in further detail below, the system memory 26 may include one or more memory devices, such as DRAM memory devices, that include a memory array fabricated and implementing techniques in accordance with one or more embodiments of the present invention.

Figure 2:
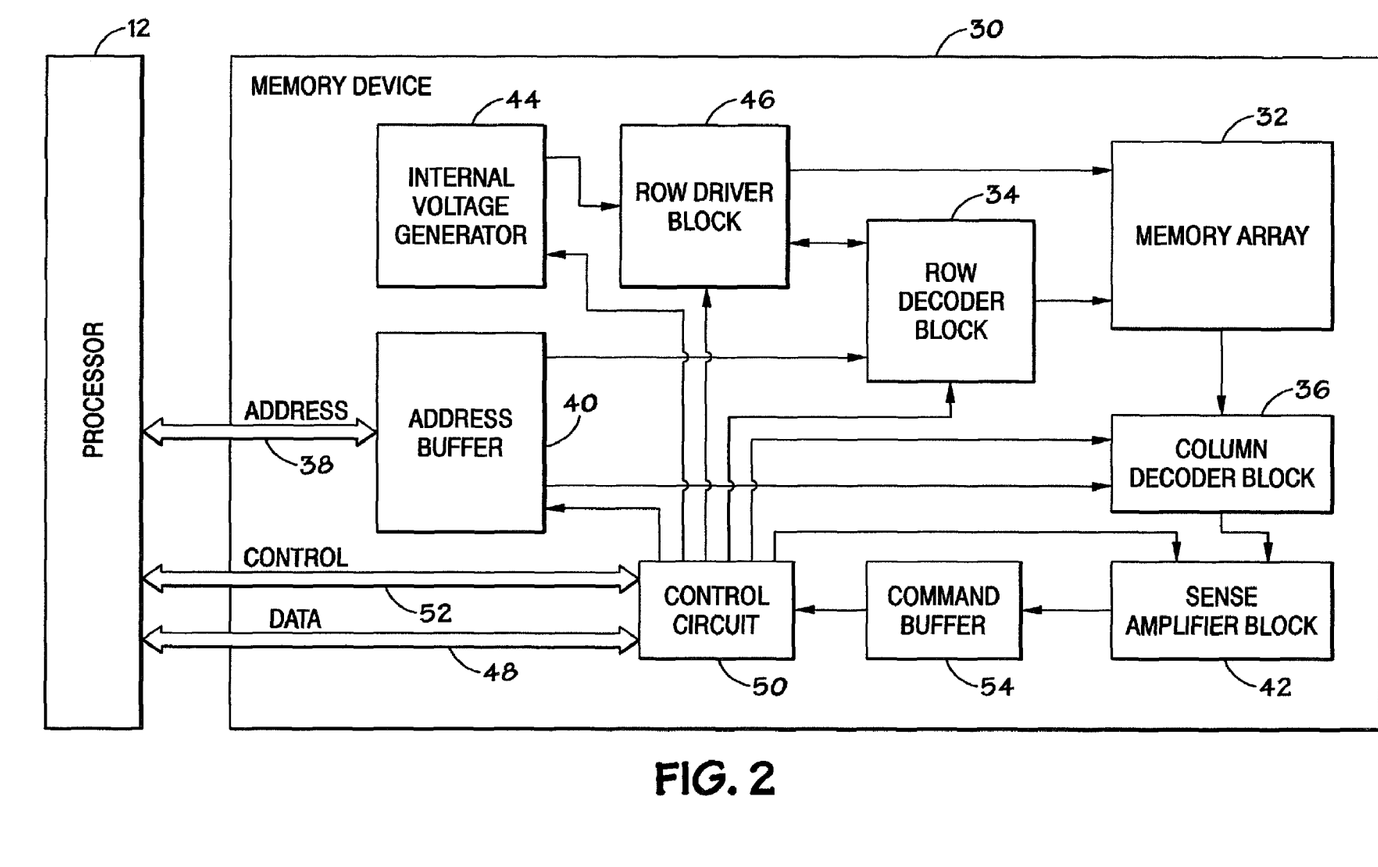
FIG. 2 is a block diagram that illustrates a memory device having a memory array fabricated in accordance with one or more embodiments of the present invention.

FIG. 2 is a block diagram that illustrates a memory device 30 that may be included as a portion of the system memory 26 of FIG. 1. As will be discussed in further detail with respect to FIG. 3, the memory device 30 may be a DRAM memory device. The memory device 30 generally includes a memory array 32. The memory array 32 generally includes many rows and columns of conductive traces arranged in a grid pattern. "Access lines" are used to access cells and generally correspond to the rows or "row lines" of the memory array 32. In the conventional art, they are generally referred to as "word lines." "Data lines" generally correspond to the columns or "column lines." In the conventional art, they are generally referred to as "digit lines" or "bit lines." The size of the memory array 32 (i.e., the number of memory cells) will vary depending on the size of the memory device 30.

To access the memory array 32, a row decoder block 34 and a column decoder block 36 are provided and are configured to receive and translate address information from the processor 12 via the address bus 38 and the address buffer 40 and to access a particular memory cell in the memory array 32. A sense amplifier block 42, having a plurality of sense amplifiers, is also provided inline with the column decoder 36 and the memory array 32. The sense amplifier block 42 senses and amplifies individual values stored in the memory cells. A row driver block 46 is provided to activate a selected word line in the memory array according to a given row address.

An internal voltage generator 44, such as a voltage generator, is provided to deliver voltages for use within the memory device 30. The internal voltage generator 44 may provide voltage levels for program, read, verify, and erase operations. The internal voltage generator 44 may include a trimming circuit to accurately regulate the voltage level output by the internal voltage generator 44.

During read and program operations, data may be transferred to and from the memory device 30 via the data bus 48. The coordination of the data and address information may be conducted through a control circuit 50. The control circuit 50 may be configured to receive control signals from the processor 12 via the control bus 52. A command buffer 54 may be configured to temporarily store commands of the control circuit 50. The control circuit 50 is coupled to each of the row decoder block 34, the column decoder block 36, the address buffer 40, the sense amplifier block 42, the internal voltage generator 44, the row driver block 46, and the command buffer 54, and is generally configured to coordinate timing and control among the various circuits in the memory device 30.

Figure 3:
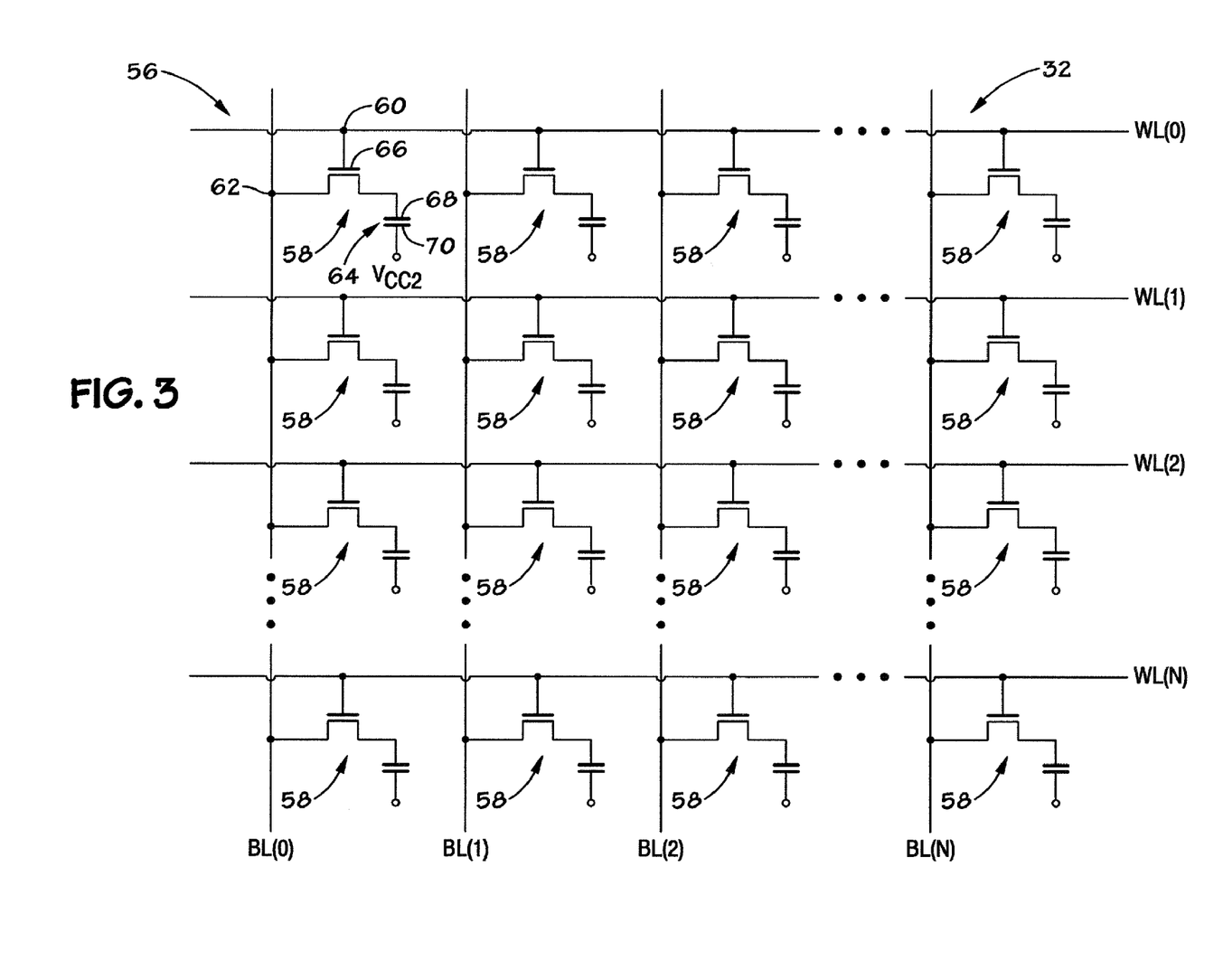
FIG. 3 is a schematic diagram of a DRAM memory array having memory cells fabricated in accordance with one or more embodiments of the present invention.

FIG. 3 illustrates an embodiment of the memory array 32 of FIG. 2. In the illustrated embodiment, the memory array 32 includes a DRAM memory array 56. The DRAM memory array 56 includes rows (or local word lines) WL(0)-WL(N) and intersecting local bit lines BL(0)-BL(N) and a plurality of memory cells 58 that are arranged in generally perpendicular rows and columns. The memory cells 58 in each row are coupled together by the respective word lines WL(0)-WL(N), and the memory cells 58 in each column are coupled together by a respective bit line or digit line BL(0)-BL(N). Specifically, each memory cell 58 includes a word line node 60 that is coupled to a respective word line WL(0)-WL(N), and each memory cell 58 includes a digit line node 62 that is coupled to a respective bit line BL(0)-BL(N).

Each memory cell 58 includes a memory element 64 that may be coupled to an access device 66. The memory element 64 may be a capacitive memory element such as a storage capacitor, and the access device 66 may be a MOSFET transistor. Capacitors may be used as the storage element in DRAM or other memory types. The gate of the transistor 66 may be coupled to the word line WL(0)-WL(M) to form the word line node 60, and one terminal of the transistor 66 may be coupled to the bit line BL(0)-BL(N) to form the bit line node 62. One plate 68 of the memory element 64 may be coupled to the other terminal of the transistor 66, and the other plate 70 of the memory element 112 may be coupled to a voltage level Vcc2, which is typically half of the voltage level Vcc.

Figure 4A:
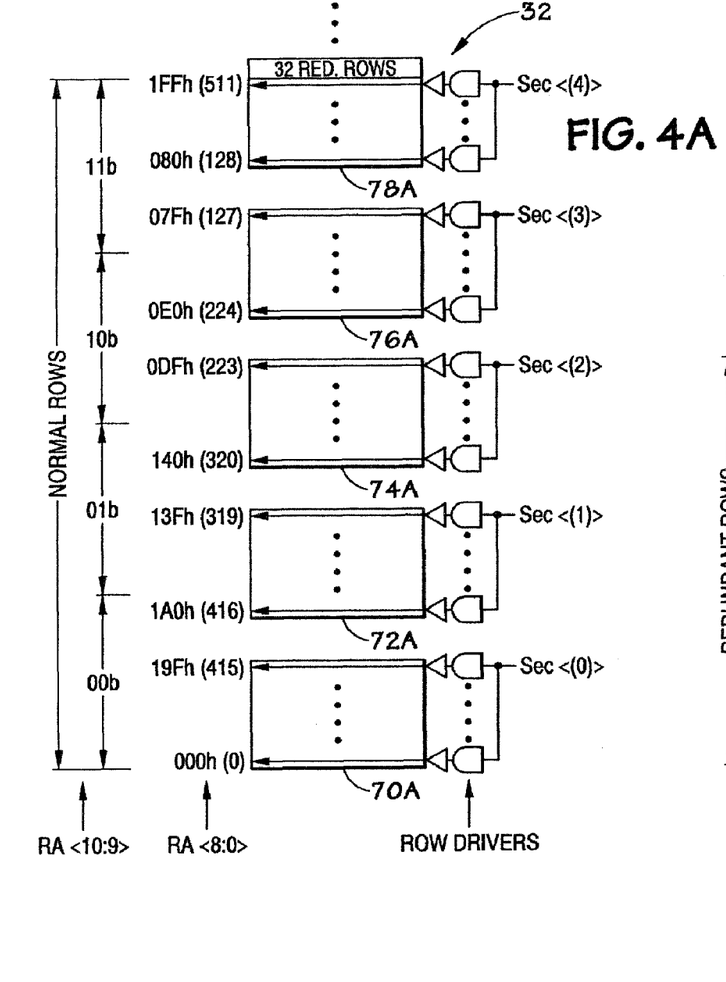
FIG. 4A is a block diagram that illustrates addressing of sections and rows of the DRAM memory array in accordance with one or more embodiments of the present invention.

FIG. 4A further illustrates an embodiment of the memory array 32 in accordance with at least one embodiment of the present technique. In the illustrated embodiment, a portion of the memory array 32 that comprises a plurality of sections 70A, 72A, 74A, 76A, and 78A is depicted. A section may comprise a grouping of rows between sense amplifier blocks. Conventionally, each of the sections 70A-78A included 2^n "normal" rows and a few redundant rows. In the embodiment depicted in FIG. 4A, however, each section of some memory arrays includes a non-2^n number of rows, such as 416 rows (e.g., to optimize digit line capacitance and chip size). In some instances, such architectures may be complex to lay out and may experience undesirable timing issues if a section is replaced (e.g., if the original section experienced a large number of failures or completely failed). In the illustrated embodiment, one section 78A includes thirty-two unused rows, in addition to three-hundred eighty-four (384) normal rows. The unused rows can be employed for redundancy (e.g., redundant rows) or for some other purpose. In one embodiment, the memory array 32 includes a plurality of these sections 70A-78A. A plurality of sections may form what is referred to as a memory bank, and a plurality of memory banks generally form the memory array 32. For example, in one embodiment, one-hundred sixty sections may form a bank of memory. In such an embodiment, the memory array 32 may include a plurality of memory banks (e.g., two groups of eight banks) where each bank includes one-hundred sixty sections.

In the prior art approaches that featured $2^n$ normal rows per section, for a 14-bit external row address, a section of a bank is selected by upper row address bits (e.g., RA<9:13>) and a row in the selected section is activated by lower row address bits (e.g., RA<0:8>). In the non-$2^n$ normal rows/section embodiments, such as that depicted in FIG. 4A, each of the rows of the sections 70A-78A is activated by an internal address. For example, in one embodiment, the first ten bits of an external row address (e.g., an address associated with a request being processed by a processor) are mapped to an internal row address (RA) that is used to activate the section and the row to be activated. In such a non-$2^n$ row/section array the internal row address assignment repeats after every 512th row, such that they increment across adjacent sections, as shown in FIG. 4A. In other words, in the illustrated embodiment, the rows in one section (e.g., Sec<0>) may be activated using internal RA<8:0>digits ranging from 000h to 19Fh, while the rows in an adjacent section (e.g., Sec<1>) may be activated using internal row address digits ranging from 1A0h to 13Fh.

The memory array 32 generally also includes a repair operation that can be employed in the case of a failure (e.g., a block failure) within a section. The repair operation is often referred to as a block repair scheme. In a typical block repair scheme a portion or all of the failed section is replaced. For example, the internal row addresses associated with the failed section are mapped to other locations within the memory 32, such as redundant rows. Accordingly, in one embodiment, the block repair includes a section replacement that involves storing all of the data of the failed section into redundant rows within the memory array 32. Further, when a section has a block failure, the sense-amp gaps (e.g., the physical gaps attributable to the sense amplifier logic that separates adjacent sections) on either side of the failed bock are sometimes replaced. Accordingly, when a section has a block failure, the adjacent sections are also replaced in some embodiments of a block repair scheme. For example, where a first section fails (e.g., section 72A), the first section and the surrounding two sections (e.g., sections 70A and 74A) are also replaced. Thus, one embodiment of the block repair scheme may employ a number of redundant rows that is three times the number of rows in one section (e.g., 3 sections*416 rows/section=1248 rows). Generally, the addresses associated with failed section and the surrounding sections may be mapped to addresses of the redundant rows.

Figure 4B:
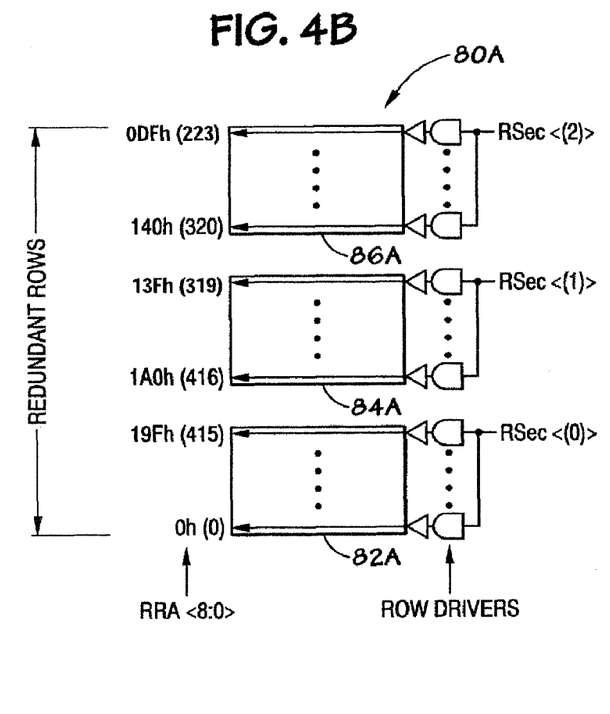
FIG. 4B is a block diagram that illustrates addressing of redundant sections and rows of the DRAM memory array in accordance with one or more embodiments of the present invention.

FIG. 4B illustrates an embodiment of a redundant row array 80A of the memory array 32, in accordance with at least one embodiment of the present technique. In the illustrated embodiment, the redundant row array 80A includes three redundant sections 82A, 84A and 86A. Each of the redundant sections 82A-86A includes four-hundred sixteen (416) redundant rows, for a total of twelve-hundred and forty-eight (1248) redundant rows. Although illustrated in three separate sections, the redundant rows can be distributed throughout the memory array 32, in some embodiments. For example, in one embodiment, the four-hundred sixteen (416) redundant rows include redundant rows of thirteen (13) sections having thirty-two (32) redundant rows each.

In one embodiment, the redundant rows of the redundant sections 82A-86A are activated via a redundant section address (RSec<0,1,2>) and a redundant row address (RRA<8:0>). The redundant section bit (RSec<0,1,2>) may be employed to select the target redundant section where the target redundant row is located, and the target redundant row address (RRA) is employed to select the target redundant row within the target redundant section.

One block repair scheme, in accordance with the previously discussed embodiments of the memory array 32, may include mapping each normal row of a replaced section (e.g., sections 70A-74A) to a redundant row of the redundant row array 80A. For example, in the illustrated embodiment, where the section 72A fails and the sections 70A-74A are replaced with redundant sections 82A, 84A and 86A, respectively, the block repair may include mapping the internal row address to redundant row address (e.g., RA<8:0>=RRA<8:0>) having the same value. However, where another section fails (e.g., section 74A) fails, mapping may employ a more complex function. For example, in one embodiment, this may include a multi-bit subtraction to properly account for the offset of the internal row addresses (RA<8:0>) to the redundant row addresses (RRA<8:0>). More specifically, values of four-hundred sixteen (416), three-hundred twenty (320), two-hundred twenty-four (224) and one-hundred twenty-eight (128) may have to be subtracted from the internal row address (RA<8:0>), respectively, to obtain the corresponding redundant row address (RRA<8:0>). Accordingly, five different calculation functions (e.g., a 9 bit adder) may be employed in a row activation routine or path. For example, where it is determined that an external address requests access to a failed section, depending on which section has failed and which sections are being replaced, the block repair may subsequently employ adder logic to implement the previously discussed subtraction technique. Unfortunately, the adder logic may require time, thereby adding an additional delay in processing the address request and slowing operation of the memory device 30. At least one additional embodiment of the present technique includes a row addressing scheme that is configured to reduce the complexity of the block repair scheme. More specifically, in some embodiments, the rows of each section include the same range of address values. For example, all of the internal rows are activated using row addresses ranging from 000h to 19Fh, as opposed to addresses that are distributed across sections. In some embodiments, such an address mapping enables a block repair scheme to replace each section without the use of adder logic, or similar steps within a row activation path, that may otherwise induce delays in executing a request for data.

Figure 5A:
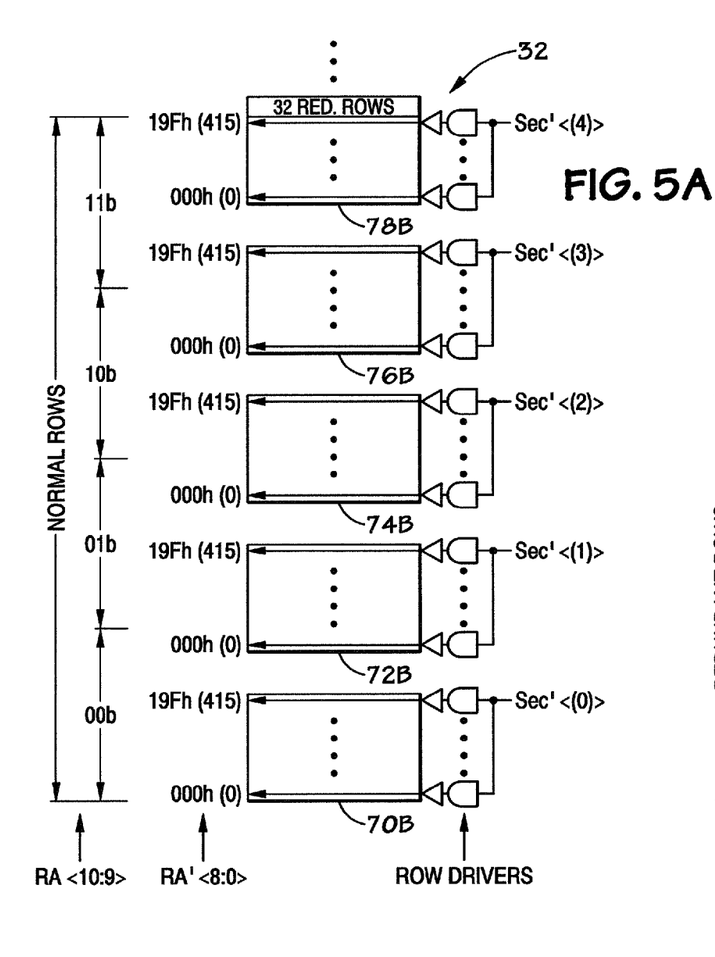
FIG. 5A is a block diagram that illustrates addressing of sections and rows of the DRAM memory array in accordance with one or more embodiments of the present invention.

FIG. 5A illustrates row addressing of the memory array 32, in accordance with one or more embodiments of the present technique. Similar to the memory array 32 discussed previously with regard to FIG. 4A, depicted is a portion of the memory array 32 that includes a plurality of sections 70B, 72B, 74B, 76B, and 78B. Each of the sections 70B-76B includes four-hundred sixteen (416) normal rows (i.e., about 2080 rows per 5 sections). In the illustrated embodiment, one section 78B includes thirty-two unused rows and three-hundred eighty-four (384) normal rows. The unused rows can be employed for redundancy (e.g., redundant rows) or some other purpose. In the illustrated embodiment, each row of each of the sections 70B-78B is activated using a value between 000h and 19Fh. Each of the sections 70B-78B is selected via a section address (Sec'<0,1,2,3,4>). In one embodiment, unlike the embodiment of FIG. 4A, all of the sections 70B-78B include the same range of row addresses (RA'<8:0>). For example, in the illustrated embodiment, each row of the sections 70B-78B is activated using an address in the range of 000h to 19Fh.

Figure 5B:
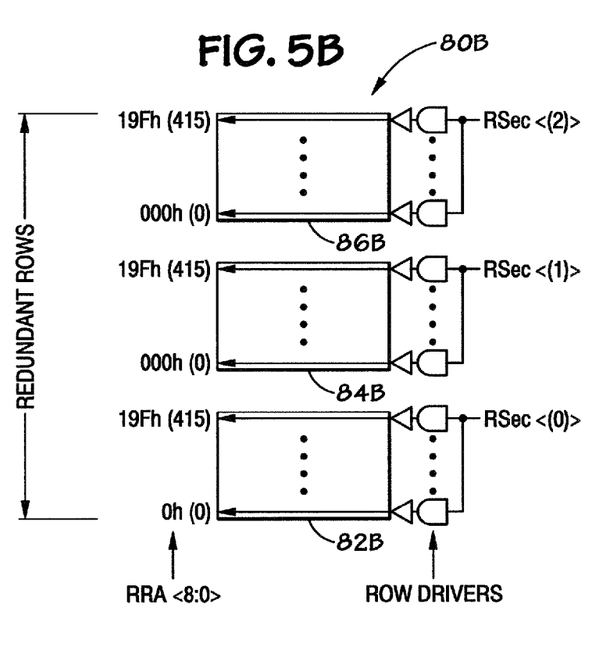
FIG. 5B is a block diagram that illustrates addressing of redundant sections and rows of the DRAM memory array in accordance with one or more embodiments of the present invention.

FIG. 5B illustrates one embodiment of a redundant row array 80B of the memory array 32, in accordance with one or more embodiments of the present technique. Similar to the memory array 32 discussed previously with regard to FIG. 4B, in the illustrated embodiment, the redundant row array 80B includes three redundant sections 82B, 84B and 86B. Each of the redundant sections 82B-86B includes four-hundred sixteen (416) redundant rows, for a total of twelve-hundred and forty-eight (1248) redundant rows. Although illustrated in three separate sections, the redundant rows can be distributed throughout the memory array 32, in some embodiments. For example, in one embodiment, the four-hundred sixteen (416) redundant rows include redundant rows of thirteen sections having thirty-two redundant rows each.

In one embodiment, the redundant rows of the redundant sections 82B-86B are activated by the redundant section address (RSec<0,1,2>) and the redundant row address (RRA<8:0>). Unlike the embodiment of FIG. 4B, in one embodiment, all of the redundant sections 82B-86B have the same values for the redundant row address (RRA<8:0>). In other words, each row of the sections 82B-86B is activated using an address in the range of 000h to 19Fh. Once again, the redundant section address (RSec<0,1,2>) is employed to select the target redundant section where the selected target redundant row is located, and the redundant row address (RRA<8:0>) is employed to activate a corresponding target redundant row within the target redundant section, in one embodiment.

Figure 6:
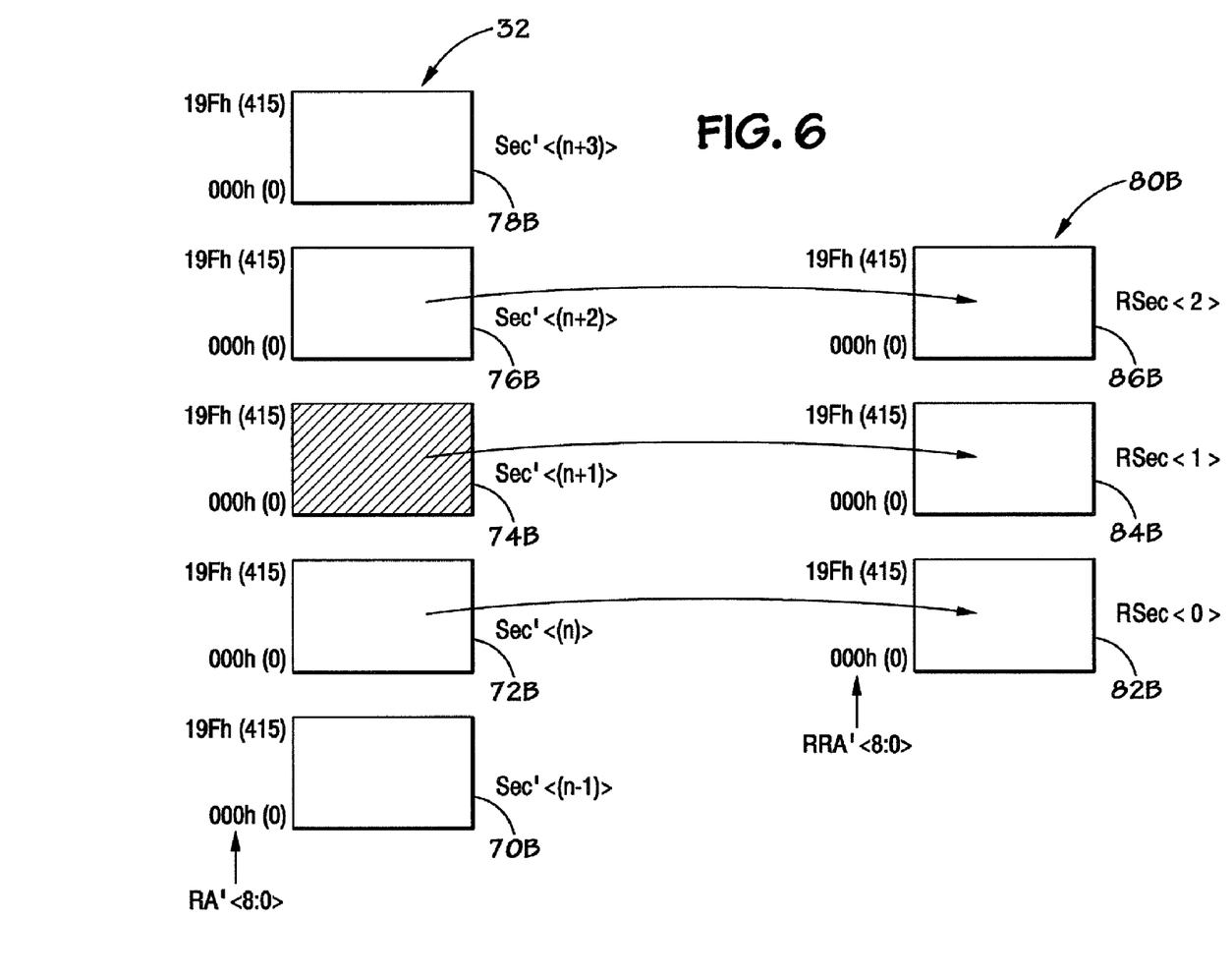
FIG. 6 is a block diagram that illustrates section replacement of the DRAM memory array in accordance with one or more embodiments of the present invention.

FIG. 6 is a block diagram that illustrates a block repair (or section replacement) in accordance with one embodiment of the present technique. In the depicted embodiment, the memory array 32 includes the five sections 70B, 72B, 74B, 76B and 78B and a redundant row array 80B that includes three redundant sections 82B, 84B, and 86B. Each of the sections and 70B-78B and the redundant sections 82B-86B include addressing in accordance with the embodiments discussed above with regard to FIGS. 5A and 5B. For example, each of the sections 70B-78B is selected by a section address (Sec'<n−1, n, n+1, n+2, n+3>) and the rows of each section 70B-78B are activated by an internal row address (RA'<8:0>). In the depicted embodiment, one of the sections 74B includes a failure (e.g., a failed block). In accordance with one embodiment of the block repair scheme (or section replacement), the section 74B including the failure and the two adjacent sections 72B and 76B are replaced with the redundant sections 82B, 84B and 86B. The value of the redundant row address (RRA<8:0>) is the same as at least some of the digits of the internal row address (RA'<8:0>). Therefore, no additional function, routine, logic, or the like, is employed to map the rows of the failed (or replaced) section to the redundant rows of the redundant sections 82B-86B. Instead, in one embodiment, only the section addresses (Sec'<n, n+1, n+2>) are mapped to section addresses (RSec<0,1,2>) that do not have the same value. Accordingly, the mapping of the section may be accomplished by simply converting the section addresses (Sec'<n, n+1, n+2>) to the replacement section addresses (RSec<0,1,2>).

Figure 7:
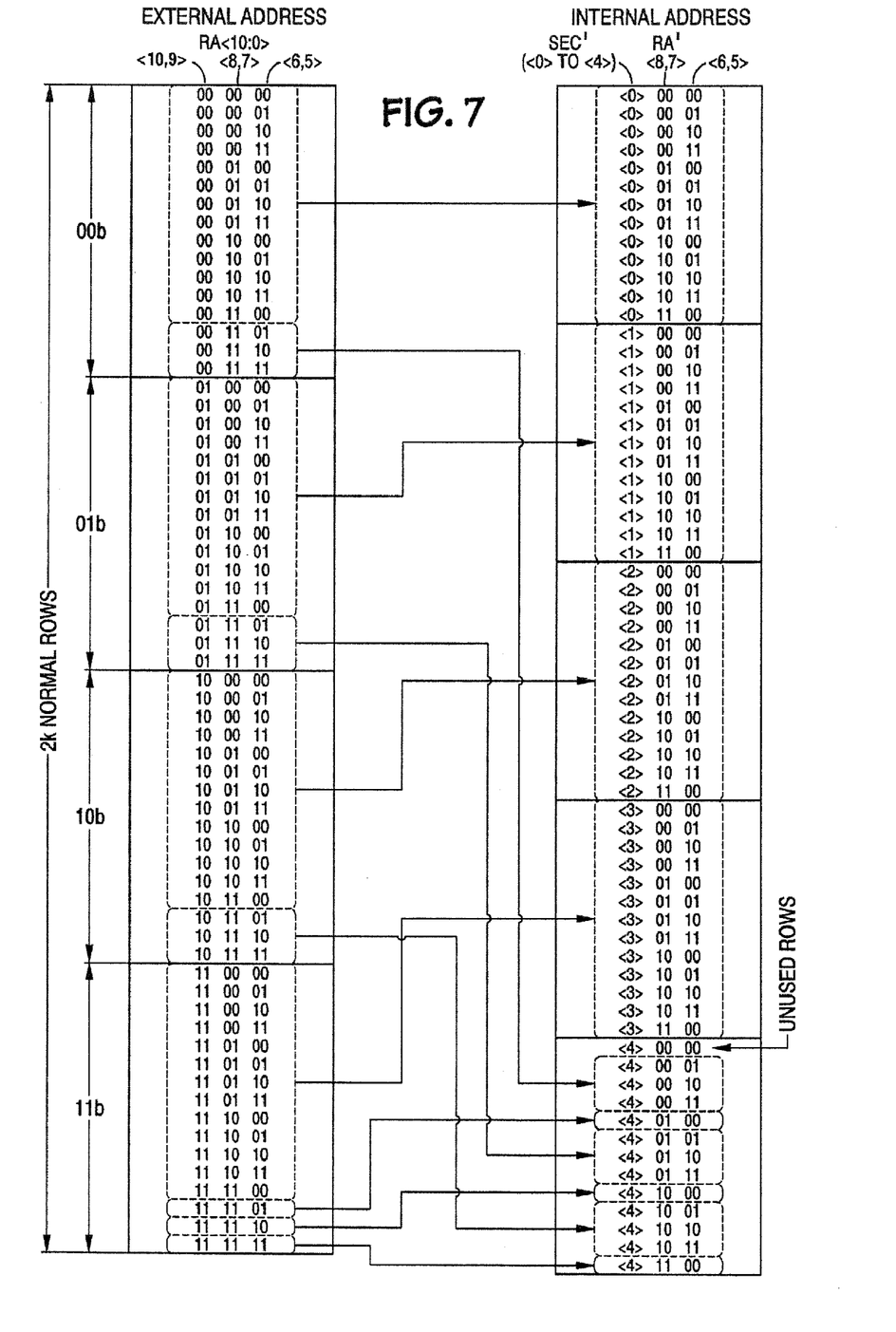
FIG. 7 is a chart that illustrates addressing mapping in accordance with one or more embodiments of the present invention.

FIG. 7 illustrates one embodiment of address mapping in accordance with one or more embodiments of the present technique. For example, the depicted embodiment includes address mapping between an external space (e.g., an external address received at the row decoder block 34) and an internal space (e.g., an internal row address). In the illustrated embodiment, the external two-thousand forty-eight row (2 k) external row address space (RA<10:0>) is mapped to an internal address space (Sec'<0:4> and RA'<8:0>). More specifically, the most significant bits (RA<10:5>) of the external address are considered in mapping the external row address (RA<10:0>) to the section address (Sec'<0:4>) and the internal row address (RA'<8:0>).

In the illustrated embodiment, the 2 k row addresses of the external address space are mapped to 2 k internal row addresses. In the illustrated embodiment, the least significant bits (RA<8:0>) are mapped directly to the least significant bits (RA'<8:0>). In other words Sec'<0:4> are determined from more significant bits of the external space (RA<10:5>) in the illustrated embodiment.

Accordingly, in one embodiment, the address mapping includes mapping a first number of normal rows (e.g., 2 k normal rows) in each division (e.g., 00b, 01b, 10b, and 11b) of the external address space (e.g., RA<10:0>) to a plurality of sections of the internal address space, and mapping the remaining normal rows in each division to another section(s). A division may be defined by 512 rows that are defined by a grouping of the least significant bits of the address (e.g., RA<8:0>). In the illustrated embodiment, the first number of normal rows is the same as the number of rows in each section (e.g., 416 rows), and the remaining number of rows is the difference between the first number of normal rows and the number of rows in a division (e.g., 512 rows−416 rows=96 rows). In one embodiment the another section(s) also includes unused rows (e.g., thirty-two (32) unused rows).

In the illustrated embodiment, the mapping from the external address (RA<10:0>) to the internal row address (RA'<8:0>) and section address (Sec'<0,1,2,3,4>) includes the following logic:
  if RA<8:5>=0000 to 1100, and RA<10:9>=00, then Sec'<0>=1 and Sec'<1,2,3,4>=0
  if RA<8:5>=0000 to 1100, and RA<10:9>=01, then Sec'<1>=1 and Sec'<0,2,3,4>=0
  if RA<8:5>=0000 to 1100, and RA<10:9>=10, then Sec'<2>=1 and Sec'<0,1,3,4>=0
  if RA<8:5>=0000 to 1100, and RA<10:9>=11, then Sec'<3>=1 and Sec'<0,1,2,4>=0
    if RA<8:5>=1101 to 1111, then Sec'<4>=1 and Sec'<0, 1, 2, 3>=0
  if RA<8:5>=1101 to 1111, and RA<10:9>=00 to 10, then RA'<8:7>=RA<10:9>
  if RA<8:5>=1101 to 1111, and RA<10:9>=11, and, then RA'<8:7>=RA<6:5>
    otherwise RA'<8:7>=RA<8:7>
  if RA<10:5>=000000 to 111100, then RA'<6:5>=RA<6:5>
    if RA<10:5>=111101 to 111111, then RA'<6:5>=00

Figure 8:
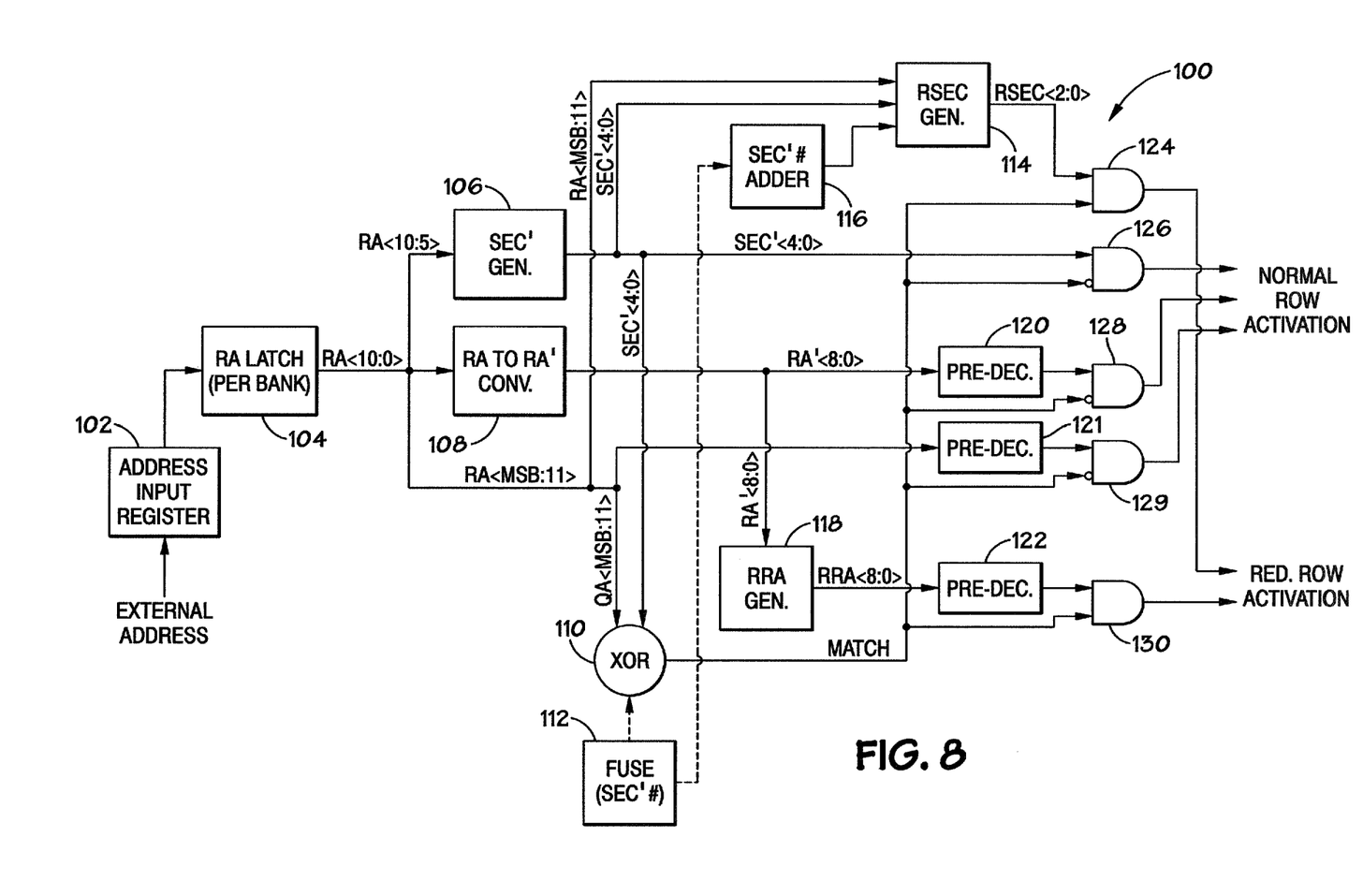
FIG. 8 is a block diagram that illustrates a row activation path in accordance with one or more embodiments of the present invention.

FIG. 8 is a block diagram of a row activation path in accordance with one or more embodiments of the present technique. In the illustrated embodiment, the row activation path 100 receives an external address and executes row activation via a defined path for normal row activation or a defined path for redundant row activation. In the illustrated embodiment, the row activation path 100 includes an address input register 102, a row address (RA) latch 104, a section generator 106, an external row address (RA) to internal row address (RA') converter (which may also be referred to as a row address converter) 108, an XOR gate (which may also be referred to as a section replacement detector) 110, a fuse 112, a replacement section (RSec) generator 114, a section adder 116, a redundant row address (RRA) generator 118, pre-decoders 120, 121 and 122, and AND gates 124, 126, 128, 129 and 130.

In one embodiment, the address input register 102 receives the external address and forwards the external address to the RA latch 104. The RA latch 104 latches in the external row address and forwards the row address to the section generator 106, the row address converter 108 and the XOR gate 110. In accordance with the address mapping discussed with regard to FIG. 7, the section generator 106 receives the external row address (RA<10:5>), determines the section address (Sec'<4:0>) based on the more significant bits of the row address (e.g., RA<10:5>), and outputs the section address (Sec'<4:0>) to the XOR gate 110, the RSec generator 114, and to one of the AND gates 126 coupled to the normal row activation path.

In accordance with the mapping discussed with regard to FIG. 7, the row address converter 108 receives the row address (RA<10:0>), determines the internal row address based on the external row address, outputs the internal row address (RA'<8:0>) to the pre-decoder 120 coupled to one of the AND gates 128 coupled to the normal row activation path, and outputs the internal row address to the RRA generator 118. In one embodiment, the row address converter 108 executes a row address conversion function (e.g., address map) that is configured to map the external address to an internal address in accordance with the previously discussed address mapping technique. Further, it is noted that in the illustrated embodiment, the row address converter 108 is located in parallel with the section generator 106 and in series with the XOR gate 110. Accordingly, in operation, the section generator 106 and the Row address converter operate in parallel (or at least start operation at the same time), in one embodiment. Therefore, any delay associated with operation of the row address converter (i.e., address mapping) 108 may be reduced due to its simultaneous operation with the section generator 106 which also consumes a given amount of time for operation. In other words, at least a portion of the delay associated with the row address converter 108 may be offset by the delay associated with the section generator 106.

As discussed above, the RA latch 104 converts the external address (RA<10:0>), or more specifically RA<10:5>, to generate RA'<8:0> for receipt by the pre-decoder 120 and the RRA generator 118. The upper digits such as RA<MSB:11> are not converted since above 2 k region, the external binary address can be directly used to select one of any of the 2 k blocks. Accordingly, the upper digits, such as RA<MSB:11>, are output directly from the RA 104 to the XOR gate 110, the RSec generator 114 and the pre-decoder 121.

In embodiments, such as those discussed previously, where the internal row address (RA'<8:0>) is the same as the redundant row address (RRA<8:0>), the RRA generator 118 may include a straight pass through that does not modify bit8 through bit0 of the internal row address. For example, in one embodiment, the RRA generator 118 may include a simple wire that connects to the pre-decoder 122. In other words, the RRA generator 118 may not include any significant structure other than a pass through wire. Therefore, the RRA generator 118 does not add any significant delay or time penalty to the operation of the row activation path 118. For example, unlike performing a binary addition at the RRA generator 118, the illustrated embodiment of the row activation path performs address mapping at the row address converter 108, and therefore does not add much if any time penalty. This is because the delay due to the address mapping in the row address converter 108 may be offset by the delay associated with the section generator 106, and, therefore, there is no appreciable delay downstream of the row address converter 108 (e.g., no appreciable delay at the RRA generator 118). Such an embodiment does not include redundant row conversion (e.g., conversion by the RRA generator 118) after operation of the XOR gate 110 as would be employed in some other instances, but instead provides for mapping at the row address converter 108 prior to operation of the XOR gate 110.

The XOR gate 110 receives the section address (RA<MSB:11> and Sec'<4:0>) and compares it to a fuse value (e.g., a value indicative of section addresses that are subject to block repair and/or that are replaced). Based on the comparison, the XOR gate 110 sends to the AND gates 124-130 an output (match) indicative of a match between the addressed section and the sections to be replaced. In the case of the section address (Sec'<4:0>) derived from the external address not matching the fuse value, the match output is configured to enable an output via the normal row activation path (i.e., the row is activated that corresponds to the internal row address). In the case of the section address (Sec'<4:0>) derived from the external address matching one or more of the fuse values, the match output is configured to enable an output via the redundant row activation path (i.e., activate a redundant row instead of the row normally associated with the internal row address).

The fuse value is also passed to the section adder 116. The section adder 116 derives the three sections to be replaced based on the fuse value, and outputs this information to the RSec generator 114. Based on the internal row address (RA<MSB:11>) and the section address (Sec'<4:0>), the RSec generator 114 outputs the redundant section address (RSec<2:0>) to the AND gate 124 and the redundant row activation path. Accordingly, in operation, the depicted embodiment of the row activation path 100 may be configured to receive an external address, address map the external address to an internal address, determine if a section replacement should be performed, and either perform a section replacement or not based on the determination. Further, performing address mapping in parallel with the operation the section generator, may reduce or eliminate delays associated with mapping of the external address.

Although the present embodiments are discussed in regard to a redundant row arrangement that includes thirty-two redundant rows included in one of every five sections 70A-78A, the present technique may be employed with other arrangements. For example, in one embodiment, redundant rows can be distributed (e.g., distributed redundant rows) in one or more of the other four sections 70A-76A, such that they all include both redundant rows and normal rows. In such an embodiment, the redundant row address and the redundant section address may be modified to account for the addresses of the distributed rows. Further, one embodiment may include the addition of simple logic gate stages in the RRA generator 118, discussed with regard to FIG. 8.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

The invention claimed is:

1. A method, comprising:
receiving a row address associated with a row of a memory section having a non-$2^n$ number of normal rows;
determining that the memory section having the non-$2^n$ number of normal rows comprises an error; and
mapping the row address to a redundant row address.

2. The method of claim 1, wherein mapping the row address to the redundant row address includes determining the redundant row address by subtracting a value from the row address.

3. The method of claim 1, wherein the memory section is one of a plurality of memory sections in a memory device and the value subtracted from the row address is selected based on a section address of the memory section.

4. The method of claim 1, comprising performing a block repair operation to replace the memory section having the non-2^n number of normal rows and the error, wherein performing the block repair operation includes mapping each row address of the normal rows of the memory section to respective redundant row addresses.

5. The method of claim 4, wherein performing the block repair operation includes replacing two additional memory sections adjacent the memory section comprising the error and replacing the two additional memory sections adjacent the memory section comprising the error includes mapping each row address of normal rows of the two additional memory sections to additional respective redundant row addresses.

6. The method of claim 1, wherein the value subtracted from the row address is equal to an additional row address associated with the first row of the memory section.

7. A method, comprising:
mapping a first number of normal rows of each of a plurality of divisions of an external address space to a plurality of sections of an internal address space; and
mapping a second number normal rows of each of the plurality of divisions of the external address space to one or more other sections of the internal address space,
wherein the second number of normal rows is equal to the difference between the number of rows in each of the plurality of divisions and the first number of normal rows.

8. The method of claim 7, wherein the first number of normal rows is 416 and the second number of normal rows is 96.

9. The method of claim 7, wherein each of the plurality of the sections comprises 416 rows and wherein each of the one or more other sections comprises 416 rows.

10. The method of claim 7, wherein the mapping of the first number of normal rows and the mapping of the second number of normal rows comprising considering less than all of the bits of the external address.

11. The method of claim 7, wherein each of the plurality of sections of the internal address space each comprise the same address range.

12. The method of claim 11, wherein the address range comprises a range of 000 h to 19 Fh.

13. A row decoder, comprising:
a redundant row activation path, comprising a row address converter comprising an output coupled to an input of a section replacement detector, wherein the redundant row activation path comprises a section generator configured to operate in parallel with the row address converter.

14. The system of claim 13, wherein the row address converter is configured to implement a row address conversion function configured to map an external address to an internal address.

15. The system of claim 13, wherein the row address converter is configured to convert an external row address to an internal row address.

16. The system of claim 15, wherein the internal row address is the same as a redundant row address.

17. The system of claim 13, wherein the section replacement detector comprises an XOR gate.

18. The system of claim 13, wherein the redundant row activation path is configured to activate a redundant row.

19. A row decoder, comprising:
a redundant row activation path, comprising a row address converter comprising an output coupled to an input of a section replacement detector,
wherein the row address converter is configured to convert an external row address to an internal row address,
wherein the internal row address is the same as a redundant row address, and
wherein the redundant row activation path comprises a redundant row address generator configured to intake the internal row address and output the redundant row address.

20. A row decoder, comprising:
a redundant row activation path, comprising a row address converter comprising an output coupled to an input of a section replacement detector, wherein the output of the row address converter is directly coupled to a pre-decoder.

21. A row decoder, comprising:
a redundant row activation path, comprising a row address converter comprising an output coupled to an input of a section replacement detector, wherein the redundant row activation path does not comprise a redundant row address generator comprising an adder configured to output a redundant row address.

* * * * *